(12) United States Patent
Endo

(10) Patent No.: US 10,614,933 B2
(45) Date of Patent: Apr. 7, 2020

(54) SHUNT RESISTOR AND MOUNTED STRUCTURE OF SHUNT RESISTOR

(71) Applicant: KOA CORPORATION, Ina-shi, Nagano (JP)

(72) Inventor: Tamotsu Endo, Nagano (JP)

(73) Assignee: KOA Corporation, Nagano (JP)

( * ) Notice: Subject to any disclaimer, the term of this patent is extended or adjusted under 35 U.S.C. 154(b) by 0 days.

(21) Appl. No.: 16/302,773

(22) PCT Filed: May 8, 2017

(86) PCT No.: PCT/JP2017/017398
§ 371 (c)(1),
(2) Date: Nov. 19, 2018

(87) PCT Pub. No.: WO2017/203963
PCT Pub. Date: Nov. 30, 2017

(65) Prior Publication Data
US 2019/0295749 A1    Sep. 26, 2019

(30) Foreign Application Priority Data
May 24, 2016   (JP) .................... 2016-103572

(51) Int. Cl.
*H01C 1/148* (2006.01)
*G01R 1/20* (2006.01)
*H01C 1/01* (2006.01)
*H01C 13/00* (2006.01)
*G01R 15/00* (2006.01)

(52) U.S. Cl.
CPC ............. *H01C 1/148* (2013.01); *G01R 1/203* (2013.01); *G01R 15/00* (2013.01); *H01C 1/01* (2013.01); *H01C 13/00* (2013.01)

(58) Field of Classification Search
CPC ........... H01C 1/148; H01C 1/01; H01C 13/00
See application file for complete search history.

(56) References Cited

U.S. PATENT DOCUMENTS 2,708,701 A * 5/1955 Viola ..................... G01R 1/203
338/49
9,378,873 B2 * 6/2016 Yoshioka ............... H01C 1/144
(Continued)

FOREIGN PATENT DOCUMENTS

| JP | 54-023577 A | 2/1979 |
| JP | 11-508996 A | 8/1999 |
| JP | 2008-047571 A | 2/2008 |

(Continued)

*Primary Examiner* — Kyung S Lee
(74) *Attorney, Agent, or Firm* — Brinks Gilson & Lione

(57) ABSTRACT

A shunt resistor including a first terminal and a second terminal, each of the first terminal and the second terminal being made of a conductive metallic material and having a first plane, a second plane, and an outer periphery as side faces thereof. The first planes of the first terminal and the second terminal are opposite each other, and a resistive element is connected to the first planes so as to connect the first terminal and the second terminal. The joint area between the resistive element and each first plane is smaller than the area of the first plane. Each of the first terminal and the second terminal has formed therein a hole portion that penetrates therethrough from the first plane to the second plane.

6 Claims, 6 Drawing Sheets

(56) References Cited

U.S. PATENT DOCUMENTS

| | | | |
|---|---|---|---|
| 9,625,494 B2* | 4/2017 | Nakamura | G01R 1/203 |
| 2012/0229247 A1* | 9/2012 | Yoshioka | G01R 1/203 |
| | | | 338/49 |

FOREIGN PATENT DOCUMENTS

| | | |
|---|---|---|
| JP | 2012-109474 A | 6/2012 |
| WO | WO 1997-002494 A1 | 1/1997 |

* cited by examiner

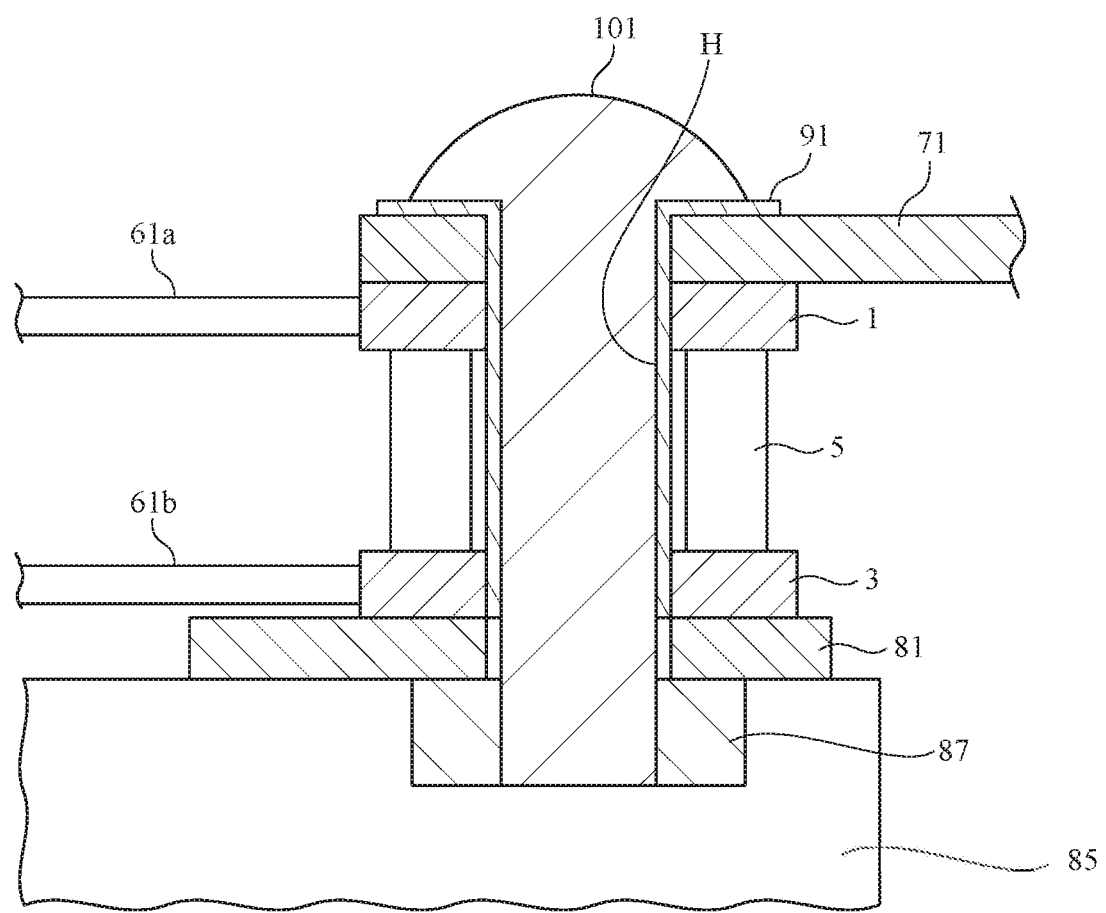

SHUNT RESISTOR AND MOUNTED STRUCTURE OF SHUNT RESISTOR

This application is a 371 application of PCT/JP2017/017398 having an international filing date of May 8, 2017, which claim priority to JP2016-103572 filed May 24, 2016, the entire content of each of which is incorporated herein by reference.

TECHNICAL FIELD

The present invention relates to a shunt resistor and a mounted structure of the shunt resistor.

BACKGROUND ART

A shunt resistor is used for sensing current flowing through a semiconductor power module mounted on an electric vehicle, for example.

As an earlier document related to a shunt resistor used for such a purpose, the following documents are known.

Patent Literature 1 below discloses a structure in which an electrode portion of a shunt resistor is formed in the shape of a bolt, and is inserted through a hole of a bus bar (i.e., a current terminal) so as to be fastened with a nut.

Patent Literature 2 below discloses a structure in which a washer-shaped shunt resistor is adapted to allow a battery terminal to be inserted therethrough and thus fixed therein.

CITATION LIST

Patent Literature

Patent Literature 1: JP 2012-109474 A
Patent Literature 2: JP 2008-047571 A

SUMMARY OF INVENTION

Technical Problem

The shunt resistor described in Patent Literature 1 above has a problem in that the operations of machining the electrode portion and attaching it are complex.

The shunt resistor described in Patent Literature 2 above has a problem in that the resistance value of the resistive element is difficult to control.

An object of the present invention is to provide a shunt resistor that can be attached easily and allows for high-accuracy sensing of current without the need for an excessive space for attachment, and a mounted structure of the shunt resistor.

Solution to Problem

According to an aspect of the present invention, there is provided a shunt resistor including a first terminal and a second terminal, each of the first terminal and the second terminal being made of a conductive metallic material and having a first plane, a second plane, and an outer periphery as side faces thereof. The first planes of the first terminal and the second terminal are opposite each other, and a resistive element is connected to the first planes so as to connect the first terminal and the second terminal. The joint area between the resistive element and each first plane is smaller than the area of the first plane. Each of the first terminal and the second terminal has formed therein a hole portion that penetrates therethrough from the first plane to the second plane.

Since the resistive element is arranged in a space between the first terminal and the second terminal that are opposite each other, the space efficiency is high.

The resistive element preferably includes a plurality of resistive elements, and the resistive elements are preferably arranged in parallel between the first terminal and the second terminal. At least one of the first terminal or the second terminal has formed therein a through-hole, the through-hole being adapted to allow the resistive element to be inserted therein or therethrough. The resistive element is preferably arranged around the hole portion.

According to the present invention, there is also provided a mounted structure of any one of the shunt resistors described above, the mounted structure including a first wiring member, a second wiring member, and the shunt resistor, the first wiring member and the second wiring member forming a current path, and the shunt resistor being adapted to short-circuit the first wiring member and the second wiring member. The first wiring member is connected to the second plane of the first terminal, and the second wiring member is connected to the second plane of the second terminal.

The mounted structure of the shunt resistor preferably further includes a fastener adapted to penetrate through the hole portions and fix the first terminal and the second terminal.

The mounted structure of the shunt resistor further preferably includes an insulator adapted to electrically insulate the fastener from the first wiring member and the first terminal or the fastener from the second wiring member and the second terminal.

The present specification incorporates the disclosure of JP Patent Application No. 2016-103572 that forms the basis of the priority claim of the present application.

Advantageous Effects of Invention

According to the present invention, the operation of attaching a shunt resistor and a mounted structure of the shunt resistor can be made simple. In addition, current can be sensed with high accuracy without the need for an excessive space for attachment.

BRIEF DESCRIPTION OF DRAWINGS

FIG. 7 is a cross-sectional view illustrating an example of attachment.

DESCRIPTION OF EMBODIMENTS

Hereinafter, a shunt resistor and a mounted structure of the shunt resistor in accordance with embodiments of the present invention will be described in detail with reference to the drawings.

First Embodiment

First, a first embodiment of the present invention will be described.

Figure 1A:
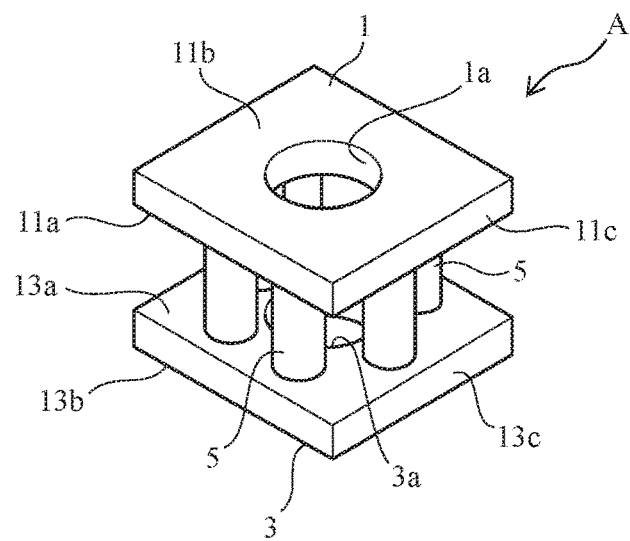
FIG. 1A is a perspective view illustrating an exemplary configuration of a shunt resistor in accordance with a first embodiment of the present invention.
Figure 1B:
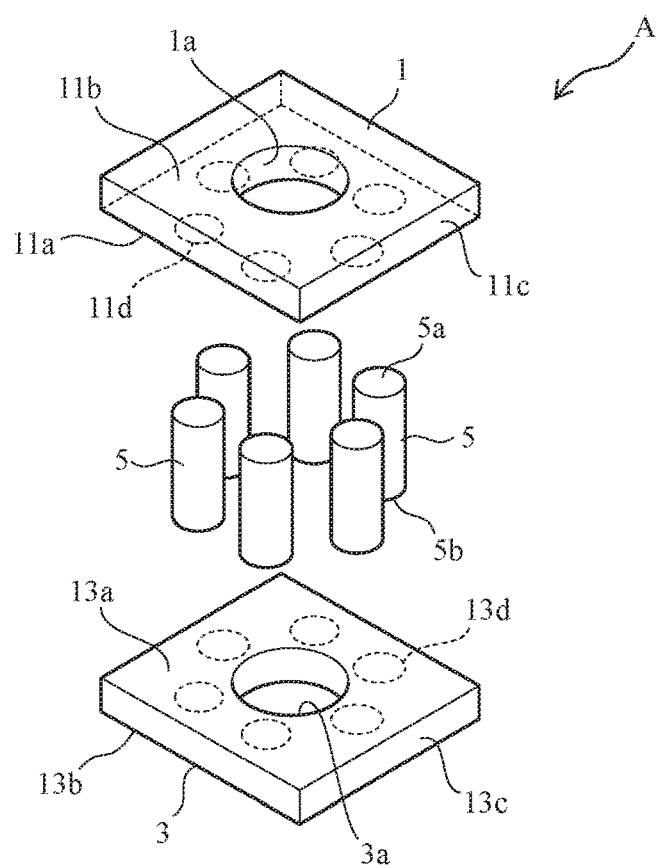
FIG. 1B is an exploded perspective view illustrating an exemplary configuration of the shunt resistor in accordance with the first embodiment of the present invention.

FIG. 1A is a perspective view illustrating an exemplary configuration of a shunt resistor in accordance with this embodiment. FIG. 1B is an exploded perspective view thereof.

A shunt resistor A in accordance with this embodiment has a first terminal (or electrode) 1 that is made of a conductive metallic material, such as Cu, and includes a first plane 11a, a second plane 11b on the rear side of the first plane 11a, and an outer periphery (or side faces) 11c thereof; and a second terminal (or electrode) 3 that is made of a conductive metallic material, such as Cu, and includes a first plane 13a, a second plane 13b, and an outer periphery (or side faces) 13c thereof.

Further, the first terminal 1 and the second terminal 3 have formed therein hole portions 1a, 3a that penetrate therethrough from the first planes 11a, 13a to the second planes 11b, 13b, respectively.

The first plane 11a of the first terminal 1 and the first plane 13a of the second terminal 3 are opposite each other, and a plurality of resistive elements 5 that connect the first terminal 1 and the second terminal 3 are provided in parallel on the respective first planes 11a, 13a. As the material of the resistive elements 5, a Cu—Ni, Cu—Mn, or Ni—Cr metallic material can be used, for example. An upper face 5a and a lower face 5b of each resistive element 5 are connected to the first planes 11a, 13a, respectively.

The joint area between each of the upper face 5a and the lower face 5b of the resistive element 5 and the first plane 11a or 13a is smaller than the area of the first plane 11a or 13a. That is, in the example of FIG. 1A and FIG. 1B, the plurality of resistive elements 5 are firmly fixed on the first planes 11a, 11 b at abutment regions 11d, 11d . . . , 13d, 13d . . . between the first planes 11a, 11b and the resistive elements 5 through welding, for example. Besides, solder and the like can also be used for fixation. In this embodiment, the plurality of resistive elements 5 are arranged concentrically around the hole portions 1a, 3a formed in the first terminal 1 and the second terminal 3, respectively, at equal intervals along the circumferential direction, for example.

A method for assembling the shunt resistor A will be briefly described. First, the first terminal 1, the second terminal 3, and the resistive elements (for example, cylindrical resistive elements) 5 are prepared, and then, the resistive elements 5 are arranged between the first terminal 1 and the second terminal 3 so as to be connected thereto through welding, for example. Accordingly, a structure can be obtained in which the respective first planes 11a, 13a of the first terminal 1 and the second terminal 3 are arranged opposite each other, and the first planes 11a, 13a are connected by the resistive elements 5.

The resistance value of the shunt resistor A can be adjusted through adjustment of the number of the resistive elements 5, the thickness thereof, the distance between the first terminal 1 and the second terminal 3, and the like.

Each of the second planes 11b, 13b on the outer side of the first terminal 1 and the second terminal 3 can be connected to a wiring member, such as a bus bar. Therefore, the second planes 11b, 13b can secure contact areas that are necessary to allow a large amount of current to flow therethrough.

Meanwhile, if each resistive element 5 is formed in a columnar shape, for example, and is joined to each of the first terminal 1 and the second terminal 3 using an area that is smaller than the area of each of the first planes 11a, 13a, the resistance value of the shunt resistor does not become too low, and thus, the designing of the resistance value becomes easy. In addition, a reduction in the height of the shunt resistor can also be achieved.

It should be noted that the concentric arrangement of the plurality of resistive elements around the hole portions 1a, 3a that are formed in the first terminal 1 and the second terminal 3, respectively, can obtain a structure in which the entire shunt resistor A is mechanically stable and the sensing accuracy is also stable with respect to changes in the frequency.

It should be noted that the shapes of the first terminal 1 and the second terminal 3 may be not only rectangles but also other polygons such as triangles, or even circular. In addition, the shapes of the hole portions 1a, 3a may be not only circular but also polygons such as rectangles. The same holds true for the other embodiments.

Second Embodiment

Figure 2:
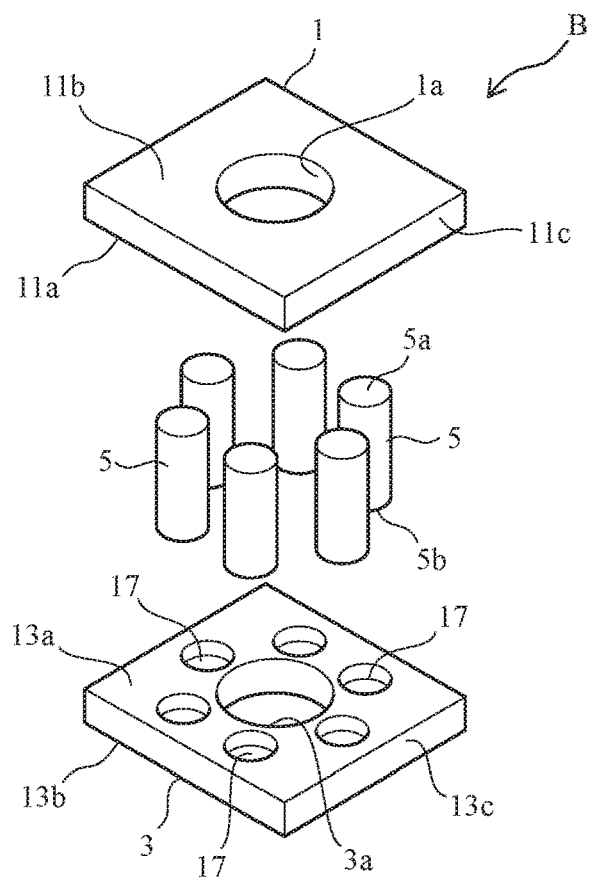
FIG. 2 is an exploded perspective view illustrating an exemplary configuration of a shunt resistor in accordance with a second embodiment of the present invention.

Next, a second embodiment of the present invention will be described. FIG. 2 is an exploded perspective view of a shunt resistor corresponding to FIG. 1B.

In a shunt resistor B illustrated in FIG. 2, dents 17 are formed in advance in portions, which are adapted to abut the resistive elements 5, of at least one of the first plane 11a or 13a. With the dents 17, the resistive elements 5 can be positioned for fixation. Further, the resistive elements 5 can be fixed more securely. Fixation between the resistive elements 5 and the first and second terminals can be performed through press fit as well as welding.

The resistance value of the shunt resistor B can also be adjusted through adjustment of the number of the resistive elements 5, the thickness thereof, the distance between the first terminal 1 and the second terminal 3 for which the depths of the dents are taken into consideration, and the like.

It should be noted that the dents 17 may be formed in both the first terminal 1 and the second terminal 3, or may be formed in only one of the first terminal 1 or the second terminal 3. When the dents 17 are formed in both the first terminal 1 and the second terminal 3, the dents may be formed in the same opposed positions or different opposed positions.

The dents may be in any form as long as they allow the resistive elements 5 to be positioned therein. For example, the dents may be ring-shaped fixation structures that protrude from the first plane 11a or 13a and are adapted to grip the resistive elements from the outer sides thereof.

Third Embodiment

Figure 3:
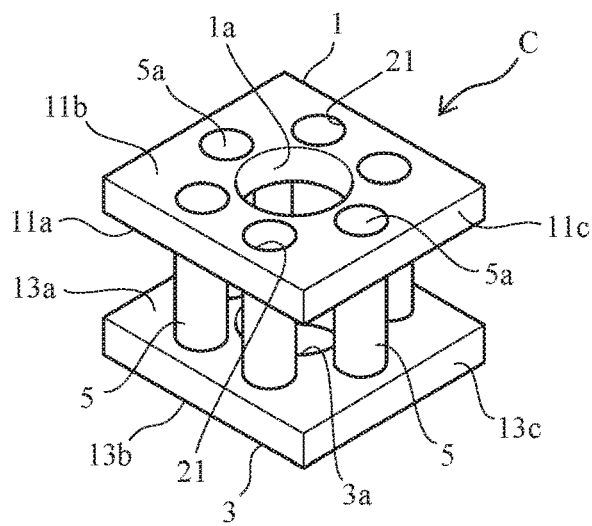
FIG. 3 is a perspective view illustrating an exemplary configuration of a shunt resistor in accordance with a third embodiment of the present invention.

Next, a third embodiment of the present invention will be described. FIG. 3 is a perspective view of a shunt resistor corresponding to FIG. 1A.

In a shunt resistor C illustrated in FIG. 3, the first terminal 1 has formed therein through-holes 21 in/through which the resistive elements 5 are inserted. With the through-holes 21 formed, the end faces 5a of the resistive elements 5 are exposed on the second plane 11b. The resistive elements 5 and the first terminal 1 may be welded together by performing laser beam or electron beam irradiation on the exposed faces 5a.

The resistance value of the shunt resistor C can be adjusted through adjustment of the number of the resistive elements 5, the thickness thereof, the distance between the first terminal 1 and the second terminal 3, and the like.

It should be noted that the resistive elements 5 may be inserted in/through both the first terminal 1 and the second terminal 3, or only one of the first terminal 1 or the second terminal 3. Only one of the first terminal 1 or the second terminal 3 may have through-holes formed therein, and the other may have the dents of the second embodiment formed therein. Alternatively, through-holes may be alternately provided such that a through-hole for a first resistive element is formed on the side of the first terminal 1, and a through-hole for a second resistive element adjacent to the first resistive element is formed on the side of the second terminal 3.

Such a configuration allows the resistive elements to be positioned easily and accurately and enhances the strength of the fixation structure.

Fourth Embodiment

Figure 4A:
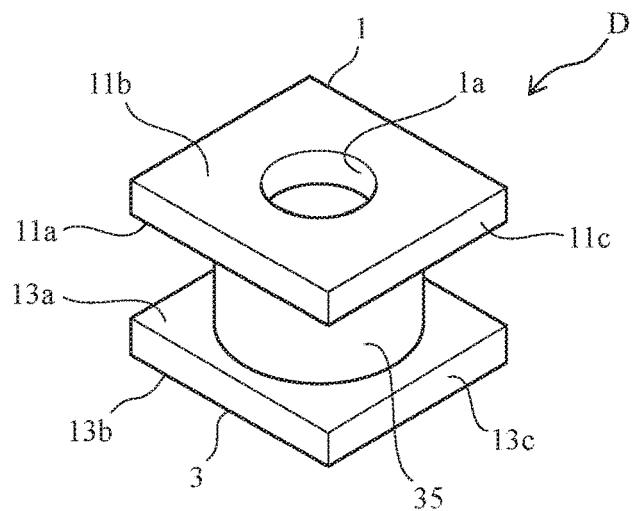
FIG. 4A is a perspective view illustrating an exemplary configuration of a shunt resistor in accordance with a fourth embodiment of the present invention.
Figure 4B:
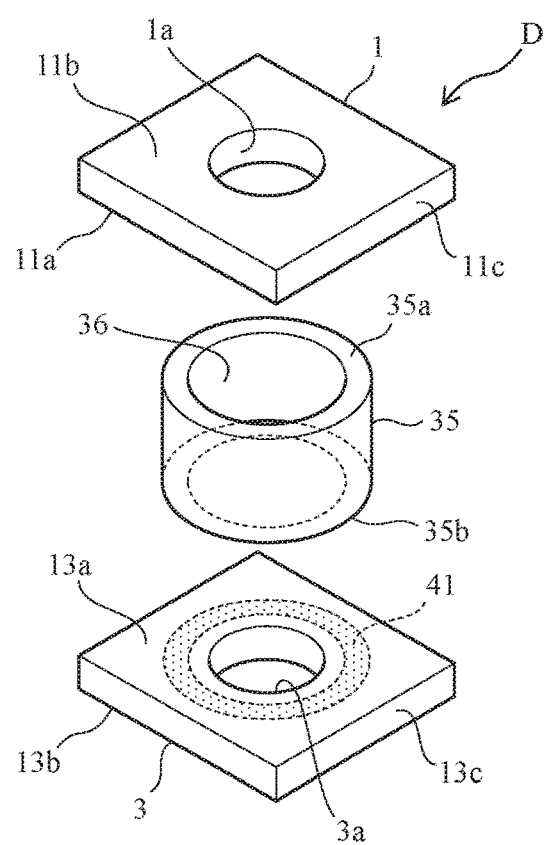
FIG. 4B is an exploded perspective view illustrating an exemplary configuration of the shunt resistor in accordance with the fourth embodiment of the present invention.

Next, a fourth embodiment of the present invention will be described. FIGS. 4A and 4B are a perspective view and an exploded perspective view, respectively, of a shunt resistor corresponding to FIGS. 1A and 1B.

In a shunt resistor D illustrated in FIGS. 4A and 4B, a resistive element 35 has a cylindrical shape with a through-hole 36. The respective hole portions 1a, 3a of the first terminal 1 and the second terminal 3 form a hole portion (i.e., through-hole) 36 penetrating through the shunt resistor D in the upward and downward direction thereof in FIGS. 4A and 4B.

It should be noted that in the cylindrical resistive element 35, as illustrated in FIG. 4B, an abutment region 41 of the first plane 13a of the second terminal 3 with a lower end face 35b of the resistive element 35 is joined to the resistive element 35 using a smaller area than that of the second terminal 3. The same holds true for an abutment portion of the first terminal 1 with an upper end face 35a of the resistive element 35. The through-hole 36 is arranged concentrically along the hole portion 3a, and preferably, the abutment region 41 between the resistive element 35 and the first plane 13a is located on the outer side of the hole portion 3a. Thus, the resistive element 35 does not block the hole portion 3a.

Thus, the resistance value of the shunt resistor does not become too low, and the designing of the resistance value becomes easy. In addition, a reduction in the height of the shunt resistor can also be achieved.

The resistance value of the shunt resistor D can be adjusted through adjustment of the thickness and diameter of the resistive element 35, the distance between the first terminal 1 and the second terminal 3, and the like.

In addition, since this embodiment uses a cylindrical resistive element that can be formed with a simple structure, the production steps can be simplified, which is advantageous.

It should be noted that the shape of the resistive element 35 may also be a hollow rectangular prism shape and the like other than the cylindrical shape.

Fifth Embodiment

Figure 5A:
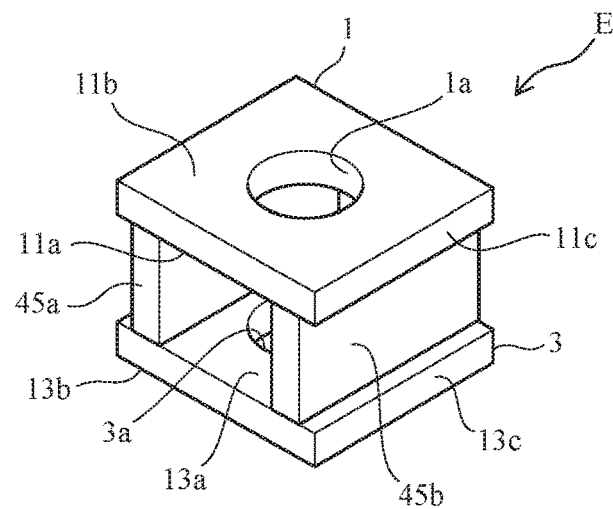
FIG. 5A is a perspective view illustrating an exemplary configuration of a shunt resistor in accordance with a fifth embodiment of the present invention.
Figure 5B:
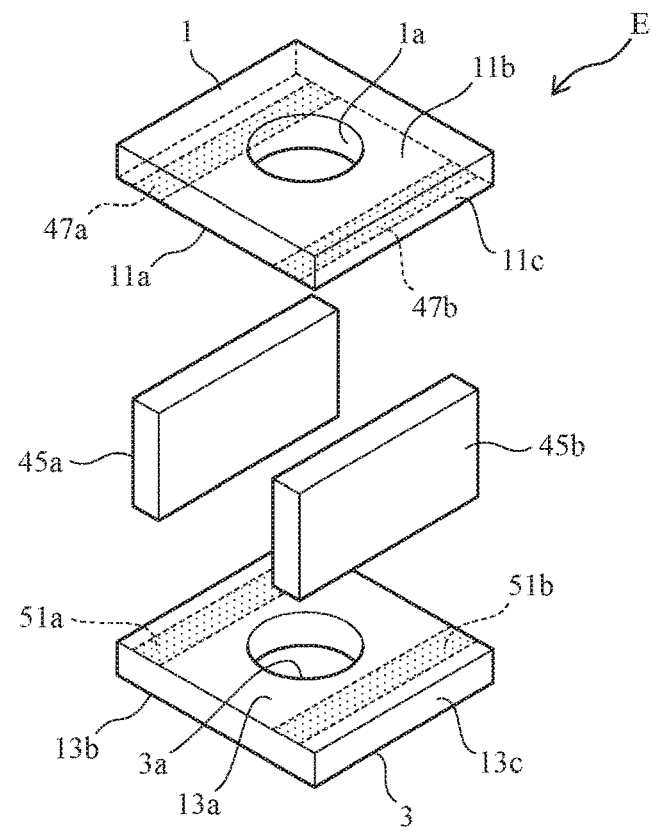
FIG. 5B is an exploded perspective view illustrating an exemplary configuration of the shunt resistor in accordance with the fifth embodiment of the present invention.

Next, a fifth embodiment of the present invention will be described. FIGS. 5A and 5B are a perspective view and an exploded perspective view, respectively, of a shunt resistor E corresponding to FIGS. 1A and 1B.

This embodiment illustrates an example of a resistive element formed in a plate shape that includes, in the example illustrated in FIGS. 5A and 5B, a first plate-shaped resistive element 45a formed along a side of the first terminal 1, and a second plate-shaped resistive element 45b formed in parallel with the first plate-shaped resistive element 45a, for example. Such resistive elements 45a, 45b are provided with joint regions 47a, 47b, 51 a, 51b at positions on the outer side of the respective hole portions 1a, 3a of the first terminal 1 and the second terminal 3.

The resistance value of the shunt resistor E can be adjusted through adjustment of the thickness and width of each resistive element 45, the distance between the first terminal 1 and the second terminal 3, and the like.

Since this embodiment uses plate-shaped resistive elements that can be formed with simple structures, the production steps can be simplified, which is advantageous.

Sixth Embodiment

Figure 6A:
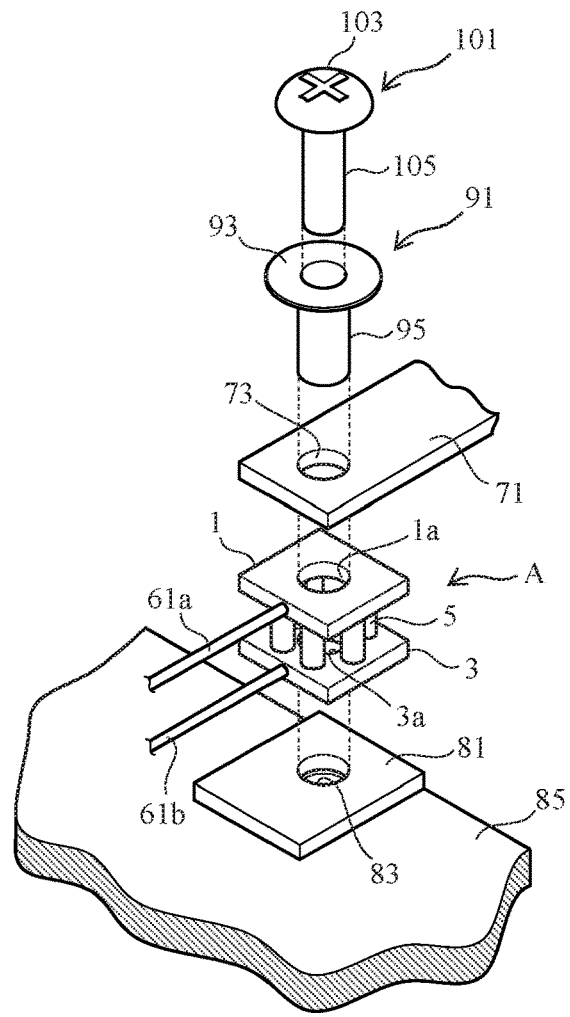
FIG. 6A is an exploded perspective view illustrating an exemplary mounted structure of the shunt resistor described in each of the aforementioned embodiments.
Figure 6B:
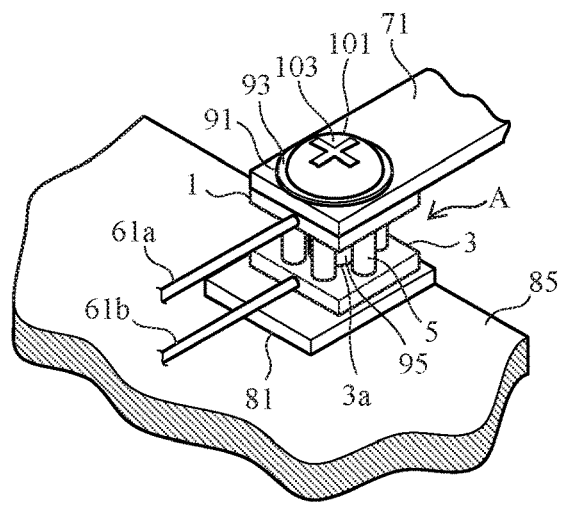
FIG. 6B is a perspective view illustrating an exemplary mounted structure of the shunt resistor described in each of the aforementioned embodiments.

Next, a sixth embodiment of the present invention will be described. FIGS. 6A and 6B are an exploded perspective view and a perspective view, respectively, illustrating an exemplary mounted structure of one of the shunt resistors A to E described in the aforementioned embodiments. FIG. 7 is a cross-sectional view illustrating an example of assembly.

As illustrated in FIGS. 6A, 6B, and 7, the shunt resistor described in each embodiment (as an example, a case where the shunt resistor A in accordance with the first embodiment is used will be described) is mounted on a semiconductor power device 85, such as an inverter.

Voltage sensing terminals 61a, 61b, which are connected to the first terminal 1 and the second terminal 3 of the shunt resistor A, respectively, extend up to a current sensing circuit (not illustrated). Accordingly, current can be sensed using the shunt resistor.

More specifically, a terminal 81 of a semiconductor power device having a through-hole 83 therein is formed on the semiconductor power device 85. Then, the hole portion 3a of the shunt resistor A is aligned with the through-hole 83 so that the shunt resistor A is arranged.

A wiring member 71, such as a bus bar (which has a corresponding through-hole 73 formed therein), is arranged on the shunt resistor A.

The semiconductor power device 85 is provided with a bolt 101, which is an example of a fastener, and a nut 87 for fixing the bolt 101.

Further, an insulating member 91 adapted to be inserted through the through-hole 73 is disposed from above the wiring member 71. The insulating member 91 has a head portion 93 and a shaft portion 95 continuous therewith.

The insulating member 91 is an example of an insulator, and has a shape that prevents contact among the bolt 101, the wiring member 71, the first terminal 1, and the second terminal 3. For example, a head portion 103 and a shaft portion 105 of a thread of the bolt 101 are configured so as not to contact the wiring member 71 or the like due to the presence of the flat head portion 93 of the insulating member 91. In addition, the shaft portion 95 of the insulating member has such a cylindrical shape that can cover the outer periphery of the shaft portion 105 of the bolt 101. It should be noted that the insulating member 91 need not penetrate through the first terminal 1 and the second terminal 3 and may be provided only between the bolt 101, the wiring member 71, and the first terminal 1. In that case, although contact may occur among the bolt 101, the second terminal 3, and the wiring member 71, there is no concern about short because the bolt 101, the wiring member 71, and the first terminal 1 are electrically insulated from one another. In should be noted that the structure of FIG. 7 is preferred since such a structure can ensure electrical insulation between the bolt 101 and the resistive elements 5 and thus can prevent a current flow between the bolt 101 and the resistive elements 5 due to dust and the like.

In addition, the insulating member 91 is arranged between the nut 87 and the series of through-holes H.

It should be noted that the bolt 101 itself may be formed as an insulator, and in such a case, an insulating film may be formed on the bolt 101.

FIG. 6B is a view illustrating an example in which the shunt resistor A is fixed on the semiconductor power device 85 using the bolt 101.

In this embodiment, the shunt resistor A is arranged between the wiring member (bus bar) 71, which is originally adapted to be attached thereto, and the terminal 81 of the semiconductor power device 85.

Therefore, the number of the assembly steps can be reduced that those of the conventional techniques. In addition, the installation space can also be reduced.

As illustrated in FIG. 6A, as the members are sequentially arranged from the lowest position in FIG. 6A and then are screwed, the mounted structure in FIG. 6B can be obtained.

It should be noted that the fixation structure is not limited to the screwed structure illustrated in FIGS. 6A, 6B and 7, and fixation can also be carried out using swaging, for example.

In the aforementioned embodiments, the configurations and the like illustrated in the attached drawings are not limited thereto, and can be changed as appropriate within the range that the advantageous effects of the present invention can be exerted. Besides, the present invention can be implemented by being changed as appropriate within the spirit and scope of the present invention.

Further, each of the configurations of the present invention can be freely selected or not selected, and an invention that includes the selected configuration is also encompassed by the present invention.

INDUSTRIAL APPLICABILITY

The present invention is applicable to shunt resistors.

All publications, patents, and patent applications cited in this specification are all incorporated by reference into this specification.

What is claimed is:

1. A shunt resistor comprising
a first terminal and a second terminal, each of the first terminal and the second terminal being made of a conductive metallic material and each having a first plane, a second plane opposite to the first place, and an outer periphery connecting the first and second planes, wherein each of the first terminal and the second terminal is formed with a center through hole, and the first planes of the first terminal and the second terminal are arranged so that the first planes of the first and second terminals face each other, and that the center through holes of the first and second terminals are aligned with respect to centers of the center through holes; and
at least one resistive element connected between the first planes of the first and second terminals so as to electrically connect the first terminal and the second terminal, wherein the at least one resistive element is arranged between the first planes of the first and second terminals so that the at least one resistive element at least partially encompasses the center through holes of the first and second terminals away from peripheries of the center through holes, and
the at least one resistive element has an area for connection with the first plane, the area for connection being smaller than an area of the first plane exclusive of the center through hole.

2. The shunt resistor according to claim 1, wherein
a plurality of the resistive elements are provided
in parallel to each other between the first terminal and the second terminal.

3. The shunt resistor according to claim 1, wherein at least one of the first terminal or the second terminal is formed with a at least one through-hole for insertion by the at least one resistive element.

4. A mounted structure of the shunt resistor according to claim 1, the mounted structure comprising a first wiring member, a second wiring member, and the shunt resistor, the first wiring member and the second wiring member forming a current path, and the shunt resistor being adapted to short-circuit the first wiring member and the second wiring member, wherein
the first wiring member is connected to the second plane of the first terminal, and
the second wiring member is connected to the second plane of the second terminal.

5. The mounted structure of the shunt resistor according to claim 4, further comprising a fastener adapted to penetrate through the hole portions and fix the first terminal and the second terminal.

6. The mounted structure of the shunt resistor according to claim 5, further comprising an insulator adapted to electrically insulate the fastener from the first wiring member and the first terminal or the fastener from the second wiring member and the second terminal.

* * * * *